(12) United States Patent
Han et al.

(10) Patent No.: US 10,417,962 B2
(45) Date of Patent: Sep. 17, 2019

(54) DATA COMPENSATING DEVICE AND DISPLAY DEVICE HAVING THE SAME

(71) Applicant: Samsung Display Co., Ltd., Yongin-si, Gyeonggi-do (KR)

(72) Inventors: Ho-Seok Han, Cheonan-si (KR); Kyung-Ho Hwang, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 15/861,536

(22) Filed: Jan. 3, 2018

(65) Prior Publication Data

US 2018/0204512 A1    Jul. 19, 2018

(30) Foreign Application Priority Data

Jan. 18, 2017   (KR) .................. 10-2017-0008846

(51) Int. Cl.
*G09G 3/20* (2006.01)
*G09G 3/3233* (2016.01)
*G11C 17/16* (2006.01)
*G09G 3/3225* (2016.01)
*G09G 3/3275* (2016.01)

(52) U.S. Cl.
CPC ......... *G09G 3/3233* (2013.01); *G09G 3/2007* (2013.01); *G09G 3/3225* (2013.01); *G09G 3/3275* (2013.01); *G11C 17/16* (2013.01); *G11C 17/165* (2013.01); *G09G 2310/027* (2013.01); *G09G 2320/0257* (2013.01); *G09G 2320/0285* (2013.01); *G09G 2320/046* (2013.01)

(58) Field of Classification Search
CPC .......................... G09G 3/3208; G09G 3/2003
See application file for complete search history.

(56) References Cited

FOREIGN PATENT DOCUMENTS

KR        10-0266212         9/2000

*Primary Examiner* — Abdul-Samad A Adediran
(74) *Attorney, Agent, or Firm* — Lewis Roca Rothgerber Christie LLP (57) ABSTRACT

A data compensating device includes a plurality of data compensating blocks. Each of the data compensating blocks includes: a memory cell configured to store an image signal; a one-time programmable (OTP) cell including a program transistor; and a calculator configured to output a compensation signal that is based on an offset signal output from the OTP cell and the image signal stored in the memory cell. The OTP cell is configured to output the output signal from the program transistor. The program transistor includes a gate oxide and is configured to be irreversibly changed based on the image signal. Thicknesses of the gate oxide of the program transistor of the OTP cell in different ones of the data compensating blocks are different from each other.

20 Claims, 11 Drawing Sheets

DATA COMPENSATING DEVICE AND DISPLAY DEVICE HAVING THE SAME

CROSS-REFERENCE TO RELATED APPLICATION

This application claims priority to and the benefit of Korean Patent Application No. 10-2017-0008846, filed on Jan. 18, 2017 in the Korean Intellectual Property Office (KIPO), the content of which is incorporated herein in its entirety by reference.

BACKGROUND

1. Field

Example embodiments of the present invention generally relate to a data compensating device and a display device having the same.

2. Description of the Related Art

Flat panel display (FPD) devices are widely used as a display device of electronic devices because FPD devices are relatively lightweight and thin compared to cathode-ray tube (CRT) display devices. Examples of FPD devices include liquid crystal display (LCD) devices, field emission display (FED) devices, plasma display panel (PDP) devices, and organic light emitting diode (OLED) display devices. OLED devices have been spotlighted as next-generation display devices because OLED devices have various advantages, such as a wide viewing angle, a rapid response speed, thin thickness, low power consumption, etc. However, an image sticking phenomenon may occur on the display devices due to degradation of the pixels as driving time goes on.

SUMMARY

Some example embodiments provide a data compensating device configured to compensate for degradation of pixels included in a display device.

Some example embodiments provide a display device configured to compensate for degradation of pixels.

According to an example embodiment, a data compensating device includes a plurality of data compensating blocks. Each of the data compensating blocks includes a memory cell configured to store an image signal, a one-time programmable (OTP) cell including a program transistor, the OTP cell being configured to output an output of the program transistor as an offset signal, and a calculator configured to output a compensation signal that is based on the offset signal output from the OTP cell and the image signal stored in the memory cell. The program transistor includes a gate oxide and is configured to be irreversibly changed based on the image signal. Thicknesses of the gate oxide of the program transistor of the OTP cells in different ones of the data compensating blocks may be different from each other.

In example embodiments, the thickness of the gate oxide of the program transistor of the OTP cell corresponding to an upper bit of the image signal may be greater than the thickness of the gate oxide of the program transistor of the OTP cell corresponding to a lower bit of the image signal.

In example embodiments, the thickness of the gate oxide of the program transistor of the OTP cell corresponding to an upper bit of the image signal may be less than the thickness of the gate oxide of the program transistor of the OTP cell corresponding to a lower bit of the image signal.

In example embodiments, the OTP cell may be broken down when a voltage of greater than a break-down voltage is accumulated on a gate electrode of the program transistor.

In example embodiments, the break-down voltage may increase as the thickness of the gate oxide of the program transistor increases.

In example embodiments, the break-down voltage may decrease as the thickness of the gate oxide of the program transistor decreases.

In example embodiments, a conducting path may be formed between a gate electrode and a channel region of the program transistor when a voltage greater than a threshold voltage is accumulated on the gate electrode of the program transistor.

In example embodiments, the program transistor may act as a capacitor when a voltage lower than a threshold voltage is accumulated on a gate electrode of the program transistor.

In example embodiments, the program transistor may act as a resistor when a voltage greater than a threshold voltage is accumulated on a gate electrode of the program transistor.

According to another example embodiment, a display device includes a display panel including a plurality of pixels, a data compensator including a plurality of compensating blocks, the data compensator configured to output a compensation signal by compensating an image signal provided to the pixels in each of the compensating blocks, a scan driver configured to provide a scan signal to the pixels, a data driver configured to convert the compensation signal into a data signal and to provide the data signal to the pixels, and a timing controller configured to generate control signals that control the data compensator, the scan driver, and the data driver. The data compensator includes a memory cell configured to store the image signal, a one-time programmable (OTP) cell including a program transistor, the OTP cell being configured to output an output of the programmable transistor as an offset signal, and a calculator configured to output the compensation signal that is based on the offset signal output from the OTP cell and the image signal stored in the memory cell. The program transistor including a gate oxide and being configured to be irreversibly changed based on the image signal. Thicknesses of the gate oxide of the program transistor of the OTP cells in different ones of the data compensating blocks are different from each other.

In example embodiments, the thickness of the gate oxide of the program transistor of the OTP cell corresponding to an upper bit of the image signal may be greater than the thickness of the gate oxide of the program transistor of the OTP cell corresponding to a lower bit of the image signal.

In example embodiments, the thickness of the gate oxide of the program transistor of the OTP cell corresponding to an upper bit of the image signal may be less than the thickness of gate oxide of the program transistor of the OTP cell corresponding to a lower bit of the image signal.

In example embodiments, the OTP cell may be broken down when a voltage of greater than a break-down voltage is accumulated on a gate electrode of the program transistor.

In example embodiments, the break-down voltage may increase as the thickness of the gate oxide of the program transistor increases.

In example embodiments, the break-down voltage may decrease as the thickness of the gate oxide of the program transistor decreases.

In example embodiments, a conducting path may be formed between a gate electrode and a channel region of the program transistor when a voltage greater than a threshold voltage is accumulated on the gate electrode of the program transistor.

In example embodiments, the program transistor may act as a capacitor when a voltage lower than a threshold voltage is accumulated on a gate electrode of the program transistor.

In example embodiments, the program transistor may act as a resistor when a voltage greater than a threshold voltage is accumulated on a gate electrode of the program transistor.

In example embodiments, the data compensator may be coupled to the timing controller or is integral with the timing controller.

In example embodiments, the data compensator may be coupled to the data driver or is integral with the data driver.

According to embodiments of the present invention, a data compensating device may generate an offset signal that compensates an image signal. The data compensating device may include one-time programmable (OTP) cells having gate oxides with different thicknesses from each other, and the OTP cells may be substantially broken down during use. For example, degradation of a pixel may be compensated by increasing an offset signal that compensates the image signal as hours of use of the pixel increases. Thus, display quality of the image may be improved. According to some embodiments of the present invention, a display device including the data compensating device may be provided. Further, a size of the display device including the data compensating device may be reduced because additional logic for compensating for degradation of the pixel may be omitted.

BRIEF DESCRIPTION OF THE DRAWINGS

Illustrative, non-limiting example embodiments of the present invention will be more clearly understood from the following detailed description, taken in conjunction with the accompanying drawings, in which.

DETAILED DESCRIPTION

It will be understood that when an element or layer is referred to as being "on" or "coupled to" another element or layer, it may be directly on or coupled to the other element or layer or one or more intervening elements or layers may also be present. When an element or layer is referred to as being "directly on" or "directly coupled to" another element or layer, there are no intervening elements or layers present. For example, when a first element is described as being "coupled" to a second element, the first element may be directly coupled to the second element or the first element may be indirectly coupled to the second element via one or more intervening elements. The same reference numerals designate the same elements. Further, the use of "may" when describing embodiments of the present invention relates to "one or more embodiments of the present invention."

It will be understood that, although the terms first, second, third, etc. may be used herein to describe various elements, components, regions, layers, and/or sections, these elements, components, regions, layers, and/or sections should not be limited by these terms. These terms are used to distinguish one element, component, region, layer, or section from another element, component, region, layer, or section. Thus, a first element, component, region, layer, or section discussed below could be termed a second element, component, region, layer, or section without departing from the teachings of example embodiments. In the figures, dimensions of the various elements, layers, etc. may be exaggerated for clarity of illustration.

The terminology used herein is for the purpose of describing particular example embodiments of the present invention and is not intended to be limiting of the described example embodiments of the present invention. As used herein, the singular forms "a" and "an" are intended to include the plural forms as well, unless the context clearly indicates otherwise. It will be further understood that the terms "includes," "including," "comprises," and/or "comprising," when used in this specification, specify the presence of stated features, integers, steps, operations, elements, and/or components but do not preclude the presence or addition of one or more other features, integers, steps, operations, elements, components, and/or groups thereof.

Hereinafter, the present inventive concept will be explained in more detail with reference to the accompanying drawings.

Figure 1:
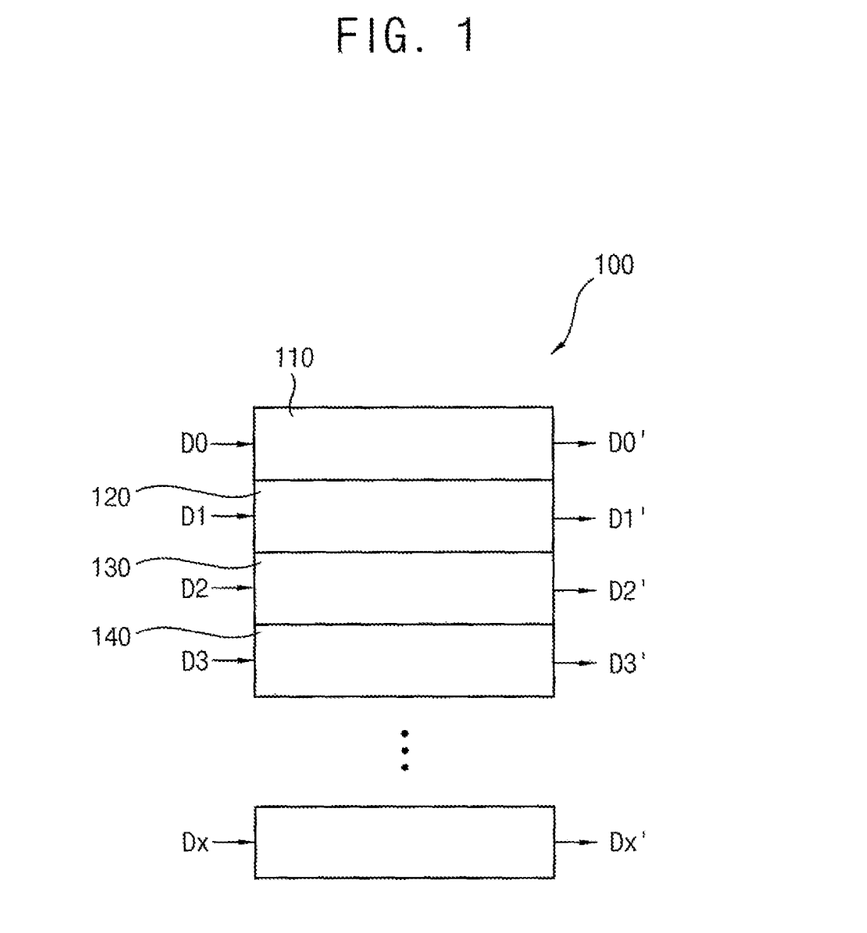
FIG. 1 is block diagram illustrating a data compensating device according to example embodiments.
Figure 2:
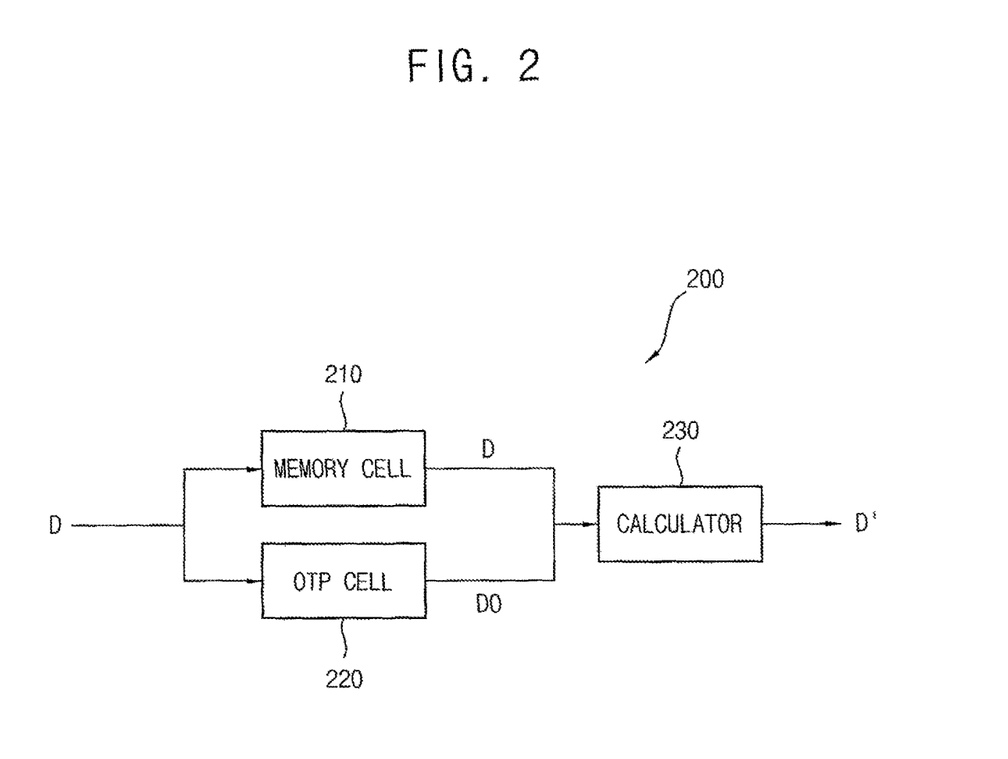
FIG. 2 is block diagram illustrating a data compensating block included in the data compensating device shown in FIG. 1.

FIG. 1 is block diagram illustrating a data compensating device according to example embodiments, and FIG. 2 is a data compensating block included in the data compensating device shown in FIG. 1.

Referring to FIG. 1, a data compensating device 100 may include a plurality of data compensating blocks 110, 120, 130, 140, etc. A first data compensating block 110 may compensate an image signal D0 (e.g., an input image signal D0) and output a compensation signal D0'. A second data compensating block 120 may compensate an image signal D1 and output a compensation signal D1'. The third data compensating block 130 may compensate an image signal D2 and output a compensation signal D2'. The fourth data compensating block 140 may compensate an image signal D3 and output a compensation signal D3'. In some embodiments, the image signal D0, D1, D2, D3, . . . , Dx may be red image data, green image data, and blue image data provided to pixels of a display device. For example, the image signal D0, D1, D2, D3, . . . , Dx may be 6- or 8-bit data.

Referring to FIG. 2, each of the data compensating blocks 200 may include a memory cell 210, a one-time programmable (OTP) cell 220, and a calculator 230.

The memory cell 210 may store the image signal D (e.g., the input image signal D). In some example embodiments, the memory cell 210 may be implemented as a non-volatile memory device. For example, the memory cell 210 may be implemented as an erasable programmable read-only memory (EPROM) device, an electrically erasable programmable read-only memory (EEPROM) device, a flash memory device, a phase-change random-access memory (PRAM) device, a resistance (or resistive) random-access memory (RRAM) device, a magnetic random-access memory (MRAM) device, a ferroelectric random-access memory (FRAM) device, etc. In other example embodiments, the memory cell 210 may be implemented as a volatile memory device. For example, the memory cell 210 may be implemented as a dynamic random-access memory (DRAM) device, a static random-access memory (SRAM) device, a mobile DRAM device, etc.

An OTP memory device is a non-volatile memory device that stores and maintains data even when power is off. The data stored in the OTP memory device may not be changeable. The OTP memory device includes an OTP cell 220. When the data is programmed in the OTP memory device, the structure of the OTP cell 220 may be irreversibly changed and the data may be stored. The OTP cell 220 may include a transistor of which an electrical property is irreversibly changed (e.g., is irreversibly changed when data is stored). The OTP cell 220 may program (or store) the data by forming a conducting path (e.g., a conduction path) in a gate oxide (e.g., a gate oxide layer) disposed between a gate and a source region, the gate and a drain region, and/or the gate and a channel region and by being broken down.

The OTP cell 220 shown in FIG. 2 may include a program transistor (e.g., a programmable transistor) which is irreversibly changed based on the image signal D and outputs an offset signal D0. The image signal D may be provided to a gate electrode of the program transistor. A voltage may be accumulated on the gate electrode in response to the image signal D. For example, when an image signal D of 1, which is a digital signal, is provided to the gate electrode of the program transistor, the voltage corresponding to the digital signal 1 may accumulate on the gate electrode of the program transistor. When an image signal D of 0, which is a digital signal, is provided to the gate electrode of the program transistor, a voltage may not accumulate on the gate electrode of the program transistor. When a voltage lower than a threshold voltage is provided to the gate electrode of the program transistor, the program transistor may act as (or perform as) a capacitor. In this case, an output voltage of the program transistor may not be changed. When a voltage greater than the threshold voltage is provided to the gate electrode of the program transistor, a conducting path that couples the gate electrode and the channel region may be formed in the gate oxide. In this case, the program transistor may act as (may perform as) a resistor. The conducting path may extend as the image signal D provided to the gate electrode is accumulated. A resistor value (e.g., a resistance) of the program transistor may decrease as the conducting path extends. Thus, the output voltage may increase. When the output voltage of the program transistor is greater than a reference voltage level (e.g., a predetermined voltage level), the digital signal of 1 may be output as the offset signal D0. When the output voltage of the program transistor is lower than the reference voltage level, the digital signal of 0 may be output as the offset signal D0. When a voltage greater than a break-down voltage is accumulated on the gate electrode of the program transistor, the OTP cell 220 may be broken down. For example, the resistor value may not change when the OTP cell 220 is broken down because the conducting path formed in the gate oxide is not extended any more. Thus, the program transistor may output the output voltage having a constant voltage level. When the output voltage of the program transistor is greater than the reference voltage, the digital signal of 1 may be output as the offset signal D0. When the output voltage of the program transistor is lower than the reference voltage, the digital signal of 0 may be output as the offset signal D0. In some example embodiments, a break-down voltage level (e.g., a threshold voltage) may increase as a thickness of the gate oxide of the program transistor increases. In other example embodiments, the break-down voltage level may decrease as the thickness of the gate oxide of the program transistor decreases. The OTP cell 220 will be described below, in more detail, with reference to FIGS. 3-5.

The calculator 230 may output a compensation signal D' that is a compensated image signal based on the offset signal D0 output from the OTP cell 220 and the image signal D stored in the memory cell 210. The calculator 230 may calculate the image signal D and the offset signal D0. For example, the calculator 230 may be implemented as an OR gate that calculates the image signal D output from the memory cell 210 and the offset signal D0 output from the OTP cell 220. When the OTP cell 220 is not broken down, the offset signal D0 may be 0 and the calculator 230 may output the image signal D as the compensation signal D'. When the OTP cell 220 is broken down, the offset signal D0 may be 1 and the calculator 230 may calculate the image signal D and the offset signal D0 and output the compensation signal D'. For example, when the OTP cell 220 is broken down, data having a grayscale value higher than a grayscale value corresponding to the image signal D may be output as the compensation signal D'.

Thicknesses of the gate oxide of the program transistor of the OTP cells 220 included in the data compensating block 200 may be formed differently from each other. The time at which the OTP cell 220 is broken down may be changed according to the thickness of the gate oxide of the program transistor. For example, a break-down voltage level may increase as the thickness of the gate oxide of the program transistor increases. Accordingly, the time at which the OTP cell 220 is broken down may be delayed. Further, the break-down voltage level may decrease as the thickness of the gate oxide of the program transistor decreases. Accordingly, the time at which the OTP cell 220 is broken down may be shortened. In some embodiments, the thickness of the gate oxide of the program transistor of the OTP cell 220 corresponding to an upper bit is greater than the thickness of the gate oxide of the program transistor of the OTP cell 220 corresponding to a lower bit. For example, in an embodiment in which an 8-bit image signal D is input, the thickness of the gate oxide of the program transistor of the OTP cell 220 corresponding to a least significant digit (LSD) may be smallest. The thickness of the gate oxide of the program transistor of the OTP cell 220 corresponding to the upper bit may increase. Here, the OTP cell 220 corresponding to the least significant digit, of which the thickness of the gate oxide of the program transistor is smallest, may be substantially broken down and output the offset signal D0. For example, the offset signal D0 output from the OTP cells 220 of the data compensating block 200 may increase as hours of use of the pixel increases.

In other example embodiments, the thickness of the gate oxide of the program transistor of the OTP cell 220 corresponding to an upper bit is less than the thickness of the gate oxide of the program transistor of the OTP cell corresponding to a lower bit. For example, when the 8-bit image signal D is input, the thickness of the gate oxide of the program transistor of the OTP cell 220 corresponding to the least significant digit may be greatest. The thickness of the gate oxide of the program transistor of the OTP cell 220 corresponding to the upper bit may be less than that of the gate oxide of the program transistor of the OTP cells 220 corresponding to lower bits. Here, the OTP cell 220 corresponding to a most significant digit (MSD), of which the thickness of the gate oxide of the program transistor is smallest, may be substantially broken down and output the offset signal D0 from the OTP cell 220. For example, the offset signal D0 output from the OTP cells 220 of the data compensating block 200 may increase as hours of use of the pixel increases.

As described above, the data compensating device 100 shown in FIG. 1 may compensate the image signal D by forming the gate oxide of the program transistor included in the OTP cells 220 to have different thicknesses from each other and substantially breaking down the OTP cell 220. For example, the data compensating device 100 shown in FIG. 1 may output the offset signal D0 by breaking down the OTP cell 220 based on the image signal D accumulated on the gate electrode of the program transistor and output the compensation signal D' by calculating the image signal D and the offset signal D0. Thus, the data compensating device 100 may compensate for degradation of the pixel to which the image signal D is provided.

Figure 3A:
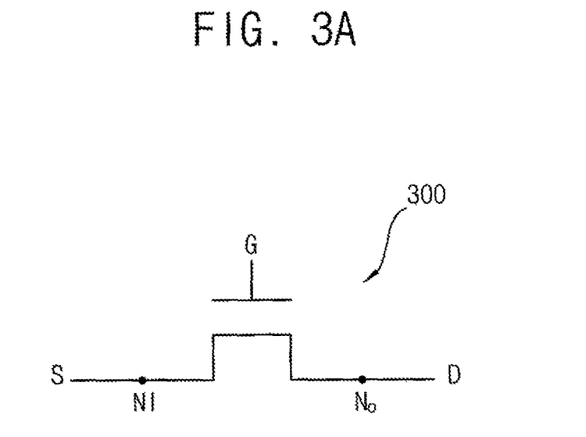
FIG. 3A is a diagram illustrating an example embodiment of an OTP cell included in the data compensating block shown in FIG. 2.
Figure 3B:
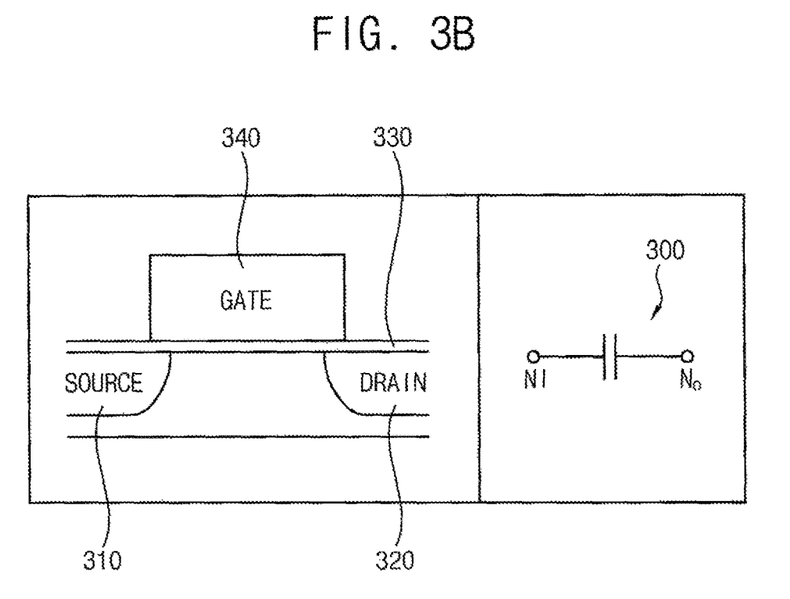
FIGS. 3B and 3C are cross-sectional views illustrating the OTP cell shown in FIG. 3A.
Figure 3C:
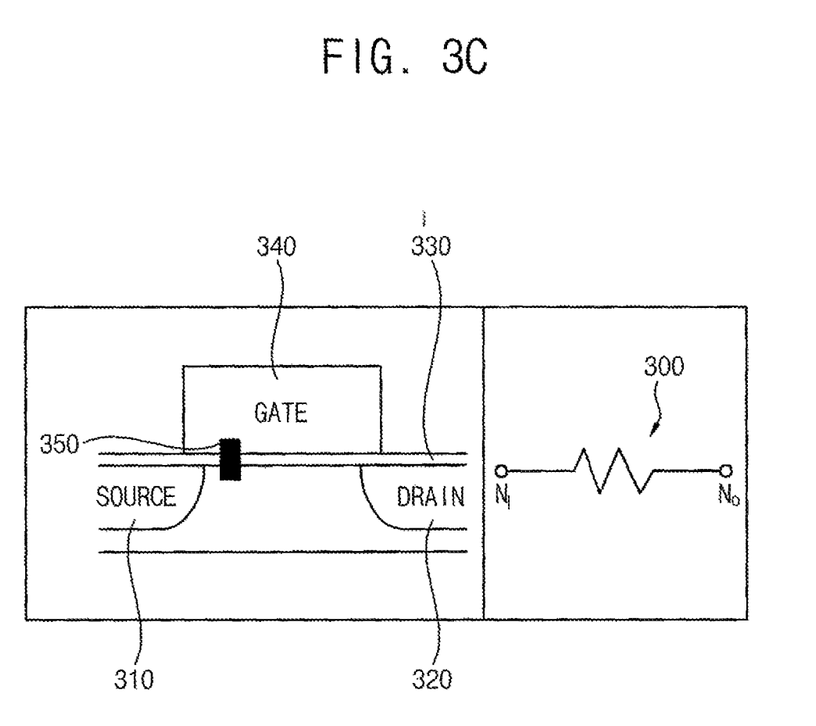
Figure 4A:
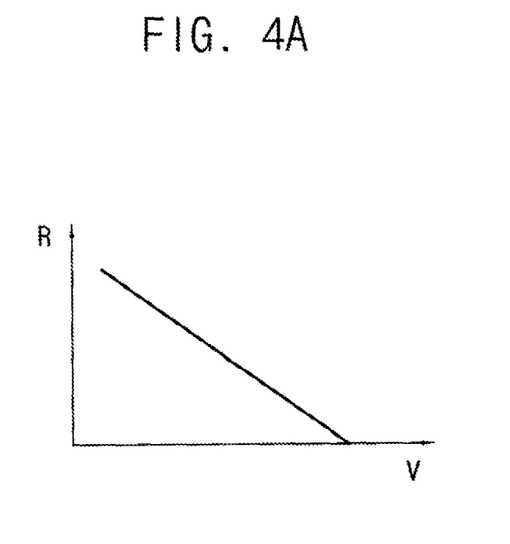
FIGS. 4A-4C are graphs illustrating an operation property of the OTP cell included in the data compensating block of FIG. 2.
Figure 4B:
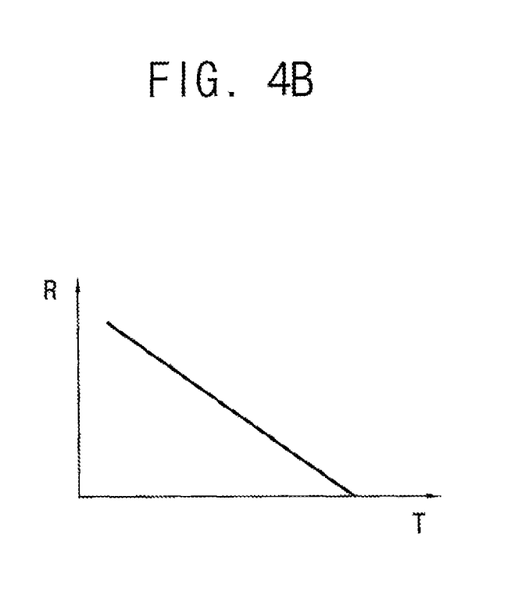
Figure 4C:
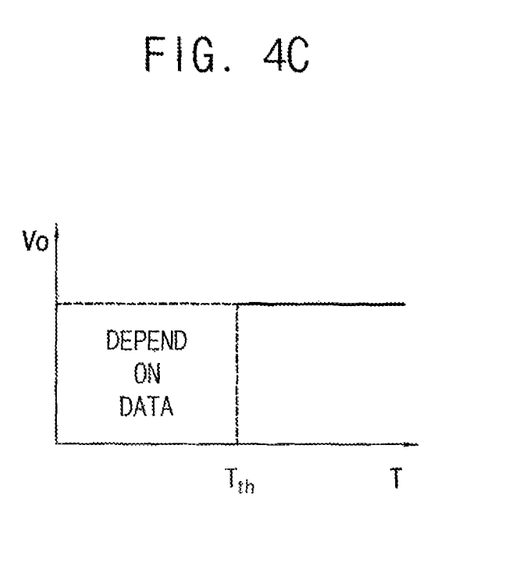
Figure 5A:
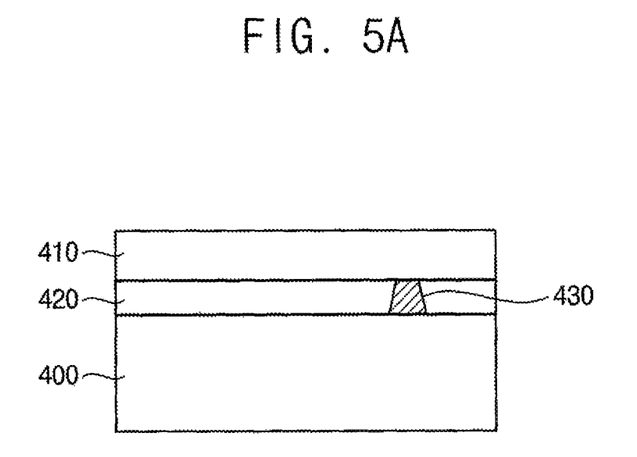
FIGS. 5A and 5B are cross-sectional views illustrating an example embodiment of an OTP cell included in the data compensating block shown in FIG. 2.
Figure 5B:
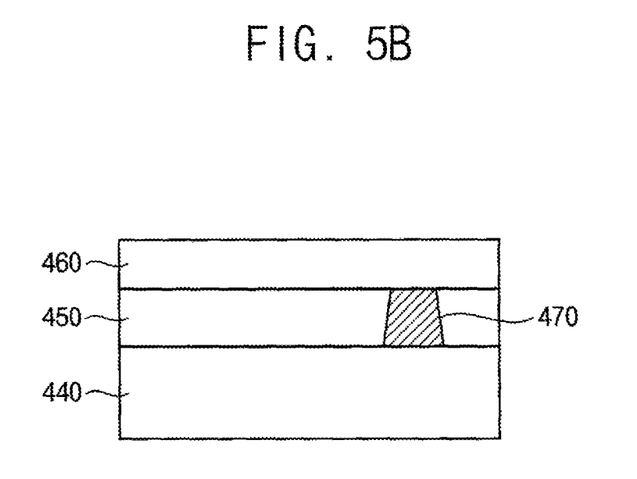

FIG. 3A is a diagram illustrating an example embodiment of an OTP cell included in the data compensating block 200 shown in FIG. 2, and FIGS. 3B and 3C are cross-sectional views illustrating the OTP cell shown in FIG. 3A. FIGS. 4A-4C are graphs illustrating an operation property of the OTP cell included in the data compensating block 200 shown in FIG. 2. FIGS. 5A and 5B are cross-sectional views illustrating an example embodiment of an OTP cell included in the data compensating block 200 shown in FIG. 2.

As described above, the OTP cell 220 may include the program transistor 300. Referring to FIG. 3A, the program transistor 300 may include a gate G, a source S, and a drain D. Referring to FIG. 3B, The voltage at an input node NI may be provided to an output node $N_o$ when a conducting path is formed between the gate 340 and the source 310 (or between the gate 340 and the drain 320 or the gate 340 and a channel region) by providing the image signal to the gate G. In some example embodiments, the program transistor 300 may be implemented as a p-type metal oxide semiconductor (PMOS) transistor. In other example embodiments, the program transistor 300 may be implemented as an n-type metal oxide semiconductor (NMOS) transistor.

Referring to FIG. 3B, the source 310 and the drain 320 may be formed on (or in) a substrate. A gate oxide 330 may be formed on the source 310 and the drain 320. The gate 340 may be formed on the gate oxide 330. The conducting path may not be formed between the gate 340 and the source 310 (or between the gate 340 and the drain 320 or the gate 340 and a channel region) when a voltage lower than the threshold voltage is accumulated on the gate 340. In this case, the program transistor 300 may act as (or may perform as) a capacitor and may maintain the voltage of the input node NI and the voltage of the output node $N_o$.

Referring to FIG. 3C, a conducting path 350 may be formed between the gate 340 and the source 310 (or, in other embodiments, between the gate 340 and the drain 320 or between the gate 340 and the channel region) when a voltage greater than the threshold voltage is accumulated on the gate 340. In this case, the program transistor 300 may act as (may perform as) a resistor and may change the voltage of the output node $N_o$.

Referring to FIG. 4A, the resistor value R (e.g., the resistance) of the program transistor 300 may decrease as the voltage V accumulated on the gate 340 increases. When a voltage greater than the threshold voltage is accumulated on the gate 340, the conducting path 350 may be formed in the gate oxide 330 and the program transistor 300 may act as a resistor. The conducting path 350 may extend as the voltage V accumulated on the gate G increases, and accordingly, the resistor value R may decrease. The voltage of the output node $N_o$ of the program transistor 300 may increase as the resistor value R of the program transistor 300 decreases.

Referring to FIG. 4B, the resistor value R of the program transistor 300 may decrease as the time T during which the voltage is accumulated on the gate 340 increases. The conducting path 350 may extend as the time T during which the voltage is accumulated on the gate 340 increases. Accordingly, the resistor value R may decrease. The voltage of the output node $N_o$ of the program transistor 300 may increase as the resistor value R of the program transistor 300 decreases.

Referring to FIG. 4C, the output voltage Vo having a constant voltage level may be output at the output node $N_o$ by breaking down the OTP cell when a voltage greater than the break-down voltage is accumulated on the gate 340 of the program transistor 300. For example, the resistor value is not additionally changed because the conducting path 350 formed in the gate oxide 330 is not extended any farther. Thus, the output voltage Vo may have a constant value. The output voltage Vo may change based on the voltage accumulated on the gate 340 before the OTP cell is broken down (e.g., before time $T_{th}$). The voltage level of the output voltage Vo may be fixed after the OTP cell is broken down (e.g., after the time $T_{th}$). Here, the output voltage Vo may have a voltage level corresponding to the digital signal 1.

Referring to FIGS. 5A and 5B, thicknesses of the gate oxides 420, 450 may be different from each other. Widths of the conducting paths 430, 470 may be different because the thickness of the gate oxide 420 in FIG. 5A and the thickness of the gate oxide 450 in FIG. 5B are different from each other. Thus, the break-down voltage that breaks down the OTP cell may be different according to the thickness of the gate oxide 420, 450. For example, the break-down voltage level of the gate oxide 450 in FIG. 5B may be greater than the break-down voltage level of the gate oxide 420 in FIG. 5A. Thus, a time at which an OTP cell including the gate oxide 450 in FIG. 5B is broken down may be longer than a time at which an OTP cell including the gate oxide 420 in FIG. 5A is broken down.

As described above, a conducting path may be formed in the gate oxide according to the voltage accumulated on the gate of the program transistor included in the OTP cell. Then, the program transistor may act as a resistor. Here, the conducting path may extend as the voltage accumulated on the gate increases, and the resistor value of the program transistor may decrease as the conducting path extends. When a voltage lower than the break-down voltage is accumulated on the gate, the conducting path is not extended any farther. Here, the OTP cell may output the output voltage having a constant voltage level. Here, the time at which the OTP cell is broken down may be controlled by controlling a thickness of the gate oxide of the program transistor because the break-down voltage level changes or varies according to the thickness of the gate oxide of the program transistor.

Figure 6:
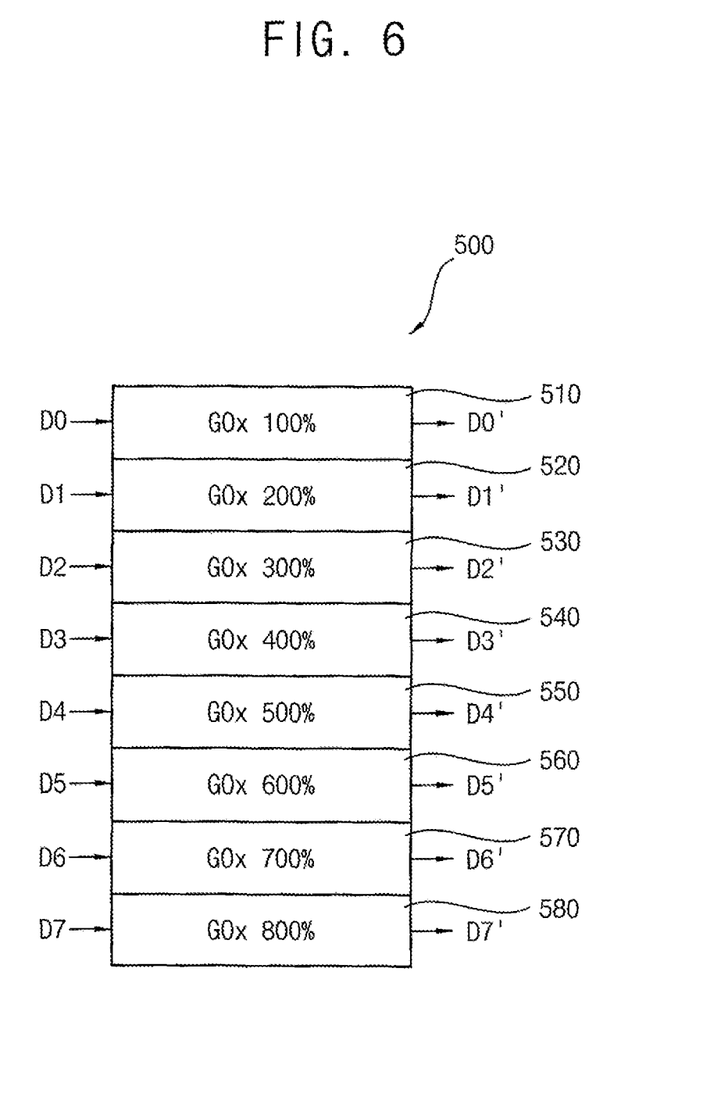
FIG. 6 is a diagram illustrating another example embodiment of the data compensating device shown in FIG. 1.

FIG. 6 is a diagram illustrating another example embodiment of the data compensating device shown in FIG. 1.

When an 8-bit image signal is provided to a pixel, a data compensating device 500 may include eight data compensating blocks 510, 520, 530, 540, 550, 560, 570, 580. Here, thicknesses of a gate oxide of the OTP cells respectively included in the data compensating blocks 510, 520, 530, 540, 550, 560, 570, 580 may substantially increase from the data compensating block 510 of the least significant digit. For example, when the thickness of the gate oxide of the OTP cell included in the data compensating block 510 corresponding to the least significant digit is 100%, the thickness of the gate oxide of the OTP cell included in the data compensating block 520 corresponding to an upper bit may be 200%, the thickness of the gate oxide of the OTP cell included in the data compensating block 530 corresponding to an upper bit may be 300%, the thickness of the gate oxide of the OTP cell included in the data compensating block 540 corresponding to an upper bit may be 400%, the thickness of the gate oxide of the OTP cell included in the data compensating block 550 corresponding to an upper bit may be 500%, the thickness of the gate oxide of the OTP cell included in the data compensating block 560 corresponding to an upper bit may be 600%, the thickness of the gate oxide of the OTP cell included in the data compensating block 570 corresponding to an upper bit may be 700%, and the thickness of the gate oxide of the OTP cell included in the data compensating block 580 corresponding to the most significant digit may be 800%. The voltage may be accumulated on the OTP cell included in each of the data compensating blocks 510, 520, 530, 540, 550, 560, 570, 580 in response to the image signal of a high level (i.e., 1). An offset signal may be output by ones of the OTP cells when a voltage greater than the break-down voltage is accumulated on the corresponding OTP cell. Here, the OTP cell included in the data compensating block 510 corresponding to the least significant digit may be broken down first and may output an offset signal first because the thickness of the gate oxide of the OTP cell included in the data compensating block 510 corresponding to the least significant digit is smallest. For example, when the OTP cell included in the data compensating block 510 corresponding to the least significant digit is broken down, the OTP cells included in the data compensating device 500 may output an offset signal of 00000001. The data compensating device 500 may output the compensation signal D0', D1', D2', D3', D4', D5', D6', D7' by calculating the image signal D0, D1, D2, D3, D4, D5, D6, D7 and the offset signal. That is, the image signal D0, D1, D2, D3, D4, D5, D6, D7 provided to the data compensating blocks 510, 520, 530, 540, 550, 560, 570, 580 may be compensated to be output as the compensation signal D0', D1', D2', D3', D4', D5', D6', D7' having a gray scale value that is higher than the gray scale value corresponding to the image signal D0, D1, D2, D3, D4, D5, D6, D7 due to the offset signal. For example, when the image signal D0, D1, D2, D3, D4, D5, D6, D7 of 00100100, corresponding to the 36 grayscale level, and the offset signal of 00000001, corresponding to when the OTP cell corresponding to the least significant digit is broken down, are input, the calculator may output the compensation signal D0', D1', D2', D3', D4', D5', D6', D7' of 00100101, corresponding to the 37 grayscale level, by calculating the image signal D0, D1, D2, D3, D4, D5, D6, D7 and the offset signal. As time passes, the OTP cell included in the data compensating block 520 corresponding to the upper bit may be broken down. In this case, the OTP cells included in the data compensating block 520 may output the offset signal of 00000011. The data compensating device 500 may output the compensation signal D0', D1', D2', D3', D4', D5', D6', D7' by calculating the image signal D0, D1, D2, D3, D4, D5, D6, D7 and the offset signal. For example, when the image signal D0, D1, D2, D3, D4, D5, D6, D7 of 00100100 corresponding to the 36 grayscale level and an offset signal of 00000011, corresponding to when the OTP cells corresponding to the least significant digit and the upper bit are broken down, are input, the calculator may output the compensation signal D0', D1', D2', D3', D4', D5', D6', D7' of 00100111 corresponding to the 39 grayscale level by calculating the image signal D0, D1, D2, D3, D4, D5, D6, D7 and the offset signal. As described above, the data compensating device 500 may substantially increase the offset signal as time goes on because additional ones of the OTP cells in the data compensating block 510 are broken down. For example, the compensating device 500 may provide the compensation signal D0', D1', D2', D3', D4', D5', D6', D7' that compensate for degradation of the pixel by increasing the offset signal that compensates the image signal D0, D1, D2, D3, D4, D5, D6, D7 as time passes (e.g., as the degradation deteriorates).

Figure 7:
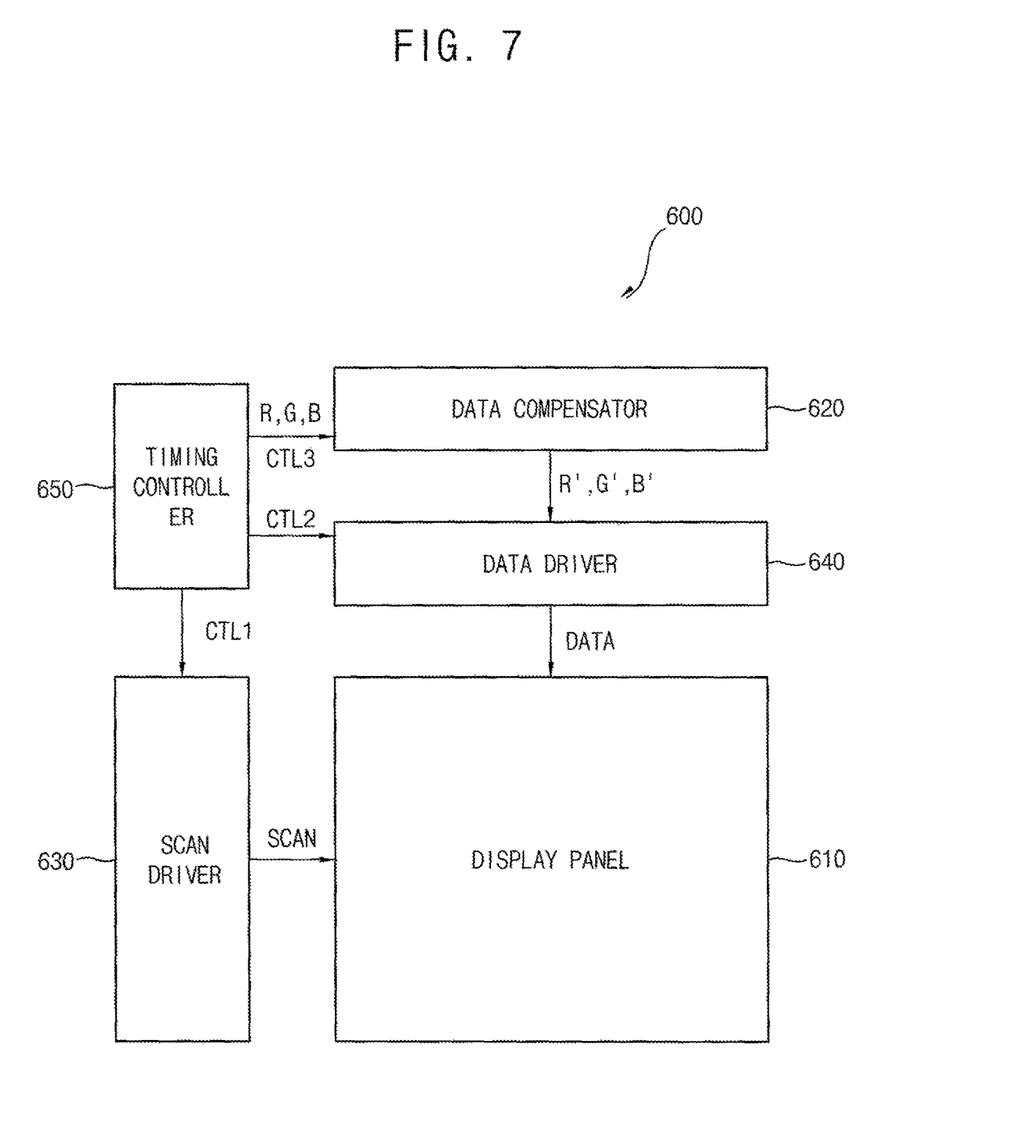
FIG. 7 is a block diagram illustrating a display device according to example embodiments.

FIG. 7 is a block diagram illustrating a display device according to example embodiments.

Referring to FIG. 7, a display device 600 may include a display panel 610, a data compensator 620, a scan driver 630, a data driver 640, and a timing controller 650.

A plurality of data lines, a plurality of scan lines, and a plurality of emission control lines may be formed on the display panel 610. A plurality of pixels may be formed at crossing regions of the data lines and the scan lines.

The data compensator 620 may include a plurality of data compensating blocks. Each of the data compensating blocks may output a compensation signal R', G', B' by compensating an image signal R, G, B provided to the pixels (e.g., provided to the pixels via the data compensator 620 from the timing controller 650). Each of the data compensating blocks may include a memory cell, an OTP cell, and a calculator. The memory cell may store the image signal R, G, B. In some example embodiments, the memory cell may be implemented as a non-volatile memory device. In other example embodiments, the memory cell may be implemented as a volatile memory device. The OTP cell may include a program transistor, which is irreversibly changed based on the image signal R, G, B, and may output an output of the program transistor as an offset signal. A voltage may be accumulated on a gate electrode of the program transistor in response to the image signal R, G, B. The program transistor may act as a capacitor when a voltage lower than the threshold voltage is accumulated on the gate electrode of the program transistor. A conducting path that couples (e.g., electrically couples) the gate electrode and a channel region may be formed in a gate oxide of the program transistor when a voltage greater than the threshold voltage is accumulated on the gate electrode of the program transistor. Here, the program transistor may act as a resistor. The OTP cell may be broken down when a voltage greater than a break-down voltage is accumulated on the gate electrode of the program transistor. In some example embodiments, the break-down voltage level may increase as the thickness of the gate oxide of the program transistor increases, and the break-down voltage level may decrease as the thickness of the gate oxide of the program transistor decreases. The calculator may output the compensation signal R', G', B' that is a compensated version of the image signal R, G, B based on the image signal R, G, B stored in the memory cell and the offset signal output from the OTP cell. For example, the calculator may be implemented as an OR gate that calculates the image signal R, G, B and the offset signal. The compensation signal R', G', B having a grayscale value that is greater the grayscale value of the image signal R, G, B, may be output when the OTP cell is broken down. The thicknesses of the gate oxide of the program transistor of the OTP cells included in the data compensating blocks may be different from each other. In some example embodiments, a thickness of the gate oxide of the OTP cell corresponding to an upper bit is greater than a thickness of the gate oxide of the OTP cell corresponding to a lower bit. Here, the OTP cell may be substantially broken down and output the offset signal from the OTP cell corresponding to the least significant digit, of which the thickness of the gate oxide of the program transistor is smallest. For example, the offset signal output from the OTP cells of the data compensating block may increase as hours of use of the pixel increases. In other example embodiments, the thickness of the gate oxide of the program transistor of the OTP cell corresponding to the upper bit is less than the thickness of the gate oxide of the program transistor of the OTP cell corresponding to the lower bit. Here, the OTP cell may be substantially broken down and may output the offset signal from the OTP cell corresponding to a most significant digit, of which the thickness of the gate oxide of the program transistor is smallest. For example, the offset signal output from the OTP cells of the data compensating block may increase as hours of use of the pixel increases.

The scan driver 630 may provide a scan signal SCAN to the pixels through the scan lines. The data driver 640 may convert the compensation signal R', G', B' provided from the data compensator 620 into a data signal DATA. The data driver 640 may convert the digital compensation signal R', G', B' into an analog data signal DATA. The data driver 640 may provide the data signal DATA to the pixels through the data lines according to the scan signal SCAN. The timing controller 650 may generate control signals CTL1, CTL2, CTL3 that control the data compensator 620, the scan driver 630, and the data driver 640. Although an embodiment in which the data compensator 620 is coupled to the data driver 640 and the timing controller 650 is described in FIG. 7, the present invention is not limited thereto. In some example embodiments, the data compensator 620 may be coupled to the data driver 640 or may be disposed in (e.g., may be integral with) the data driver 640. In other example embodiments, the data compensator 620 may be coupled to the timing controller 650 or may be disposed in the timing controller 650.

As described above, the display device 600 shown in FIG. 7 may include the data compensator 620 that compensates the image signal R, G, B by forming the gate oxide of the program transistors included in the OTP cells to have different thicknesses and substantially breaking down the OTP cells. For example, the display device 600 may output the compensation signal that compensates for degradation of the pixel by substantially breaking down the OTP cells included in the data compensator 620 and the offset signal may substantially increase as hours of use of the pixel increases.

Figure 8:
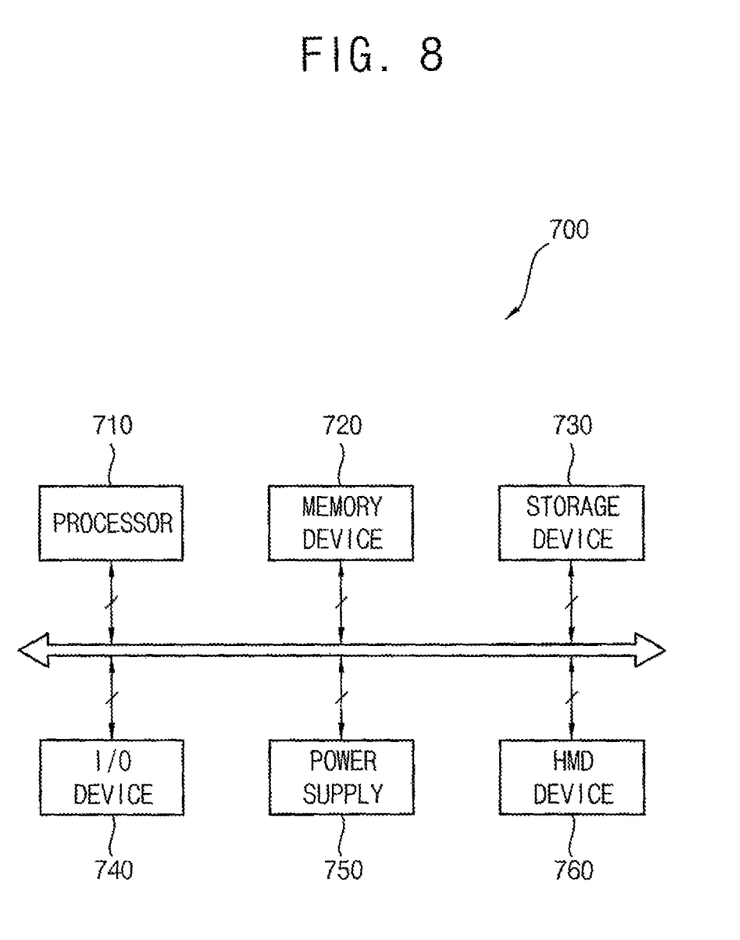
FIG. 8 is a block diagram illustrating an electronic device according to an example embodiment.
Figure 9:
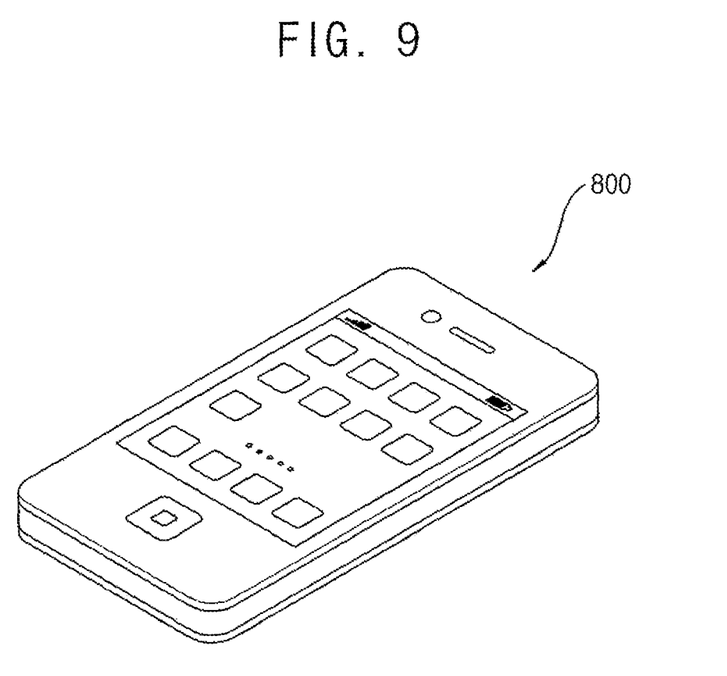
FIG. 9 is a block diagram illustrating an example embodiment in which the electronic device shown in FIG. 8 is implemented in a smart phone.

FIG. 8 is a block diagram illustrating an electronic device according to an example embodiment, and FIG. 9 is an example embodiment in which the electronic device shown in FIG. 8 is implemented as a smart phone.

Referring to FIGS. 8 and 9, an electronic device 700 may include a processor 710, a memory device 720, a storage device 730, an input/output (I/O) device 740, a power device 750, and a display device 760. Here, the electronic device 700 may correspond to the electronic device 600 shown in FIG. 7. In addition, the electronic device 700 may further include a plurality of ports for communicating with a video card, a sound card, a memory card, a universal serial bus (USB) device, other electronic devices, etc. Although it is illustrated in FIG. 9 that the electronic device 700 is implemented as a smart phone 800, the present invention is not limited to any particular type of electronic device.

The processor 710 may perform various computing functions. The processor 710 may be a microprocessor, a central processing unit (CPU), etc. The processor 710 may be coupled to other components via an address bus, a control bus, a data bus, etc. Further, the processor 710 may be coupled to an extended bus, such as a surrounded component interconnect (PCI) bus. The memory device 720 may store data for operations of the electronic device 700. For example, the memory device 720 may include a non-volatile memory device, such as an erasable programmable read-only memory (EPROM) device, an electrically erasable programmable read-only memory (EEPROM) device, a flash memory device, a phase change random-access memory (PRAM) device, a resistance or resistive random-access memory (RRAM) device, a nano-floating gate memory (NFGM) device, a polymer random-access memory (PoRAM) device, a magnetic random-access memory (MRAM) device, a ferroelectric random access memory (FRAM) device, etc., and/or a volatile memory device, such as a dynamic random-access memory (DRAM) device, a static random-access memory (SRAM) device, a mobile DRAM device, etc. The storage device 730 may be a solid stage drive (SSD) device, a hard disk drive (HDD) device, a CD-ROM device, etc.

The I/O device 740 may be an input device, such as a keyboard, a keypad, a touchpad, a touch-screen, a mouse, etc., and/or an output device, such as a printer, a speaker, etc. In some example embodiments, the display device 760 may be included as the I/O device 740. The power device 750 may provide power for operations of the electronic device 700. The display device 760 may communicate with other components via the buses or other communication links. As described above, the display device may include a display panel, a data compensator, a scan driver, a data driver, and a timing controller. The display panel may include a plurality of pixels. The data compensator may include a plurality of compensating blocks. Each of the compensating blocks may compensate an image signal provided to the pixels and output the compensated image signal as a compensating signal. The data compensating blocks may include OTP cells. Thicknesses of gate oxide of a program transistor of the OTP cell included in the data compensating blocks may be different from each other. The OTP cells may be substantially broken down according to hours of use of the pixel. The offset signal output from the OTP cells of the data compensation blocks may increase as the OTP cells are broken down. The data compensating block may output a compensation signal that compensates for degradation of the pixel by increasing the offset signal output from the OTP cells as hours of use of the pixel increases.

Embodiments of the present inventive concept may be applied to a display device and an electronic device including the display device. For example, embodiments of the present inventive concept may be applied to a computer monitor, a laptop, a digital camera, a cellular phone, a smart phone, a smart pad, a television, a personal digital assistant (PDA), a portable multimedia player (PMP), an MP3 player, a navigation system, a game console, a video phone, etc.

The foregoing is illustrative of example embodiments and is not to be construed as limiting the present invention. Although a few example embodiments have been described, those skilled in the art will readily appreciate that many modifications are possible to the example embodiments without materially departing from the features and aspects of the present inventive concept. Accordingly, all such modifications are intended to be included within the scope of the present inventive concept as defined by the claims and their equivalents. Therefore, it is to be understood that the foregoing is illustrative of various example embodiments and is not to be construed as limiting the present invention to the example embodiments disclosed herein, and that modifications to the disclosed example embodiments, as well as other example embodiments, are intended to be included within the scope of the appended claims and their equivalents.

What is claimed is:

1. A data compensating device comprising a plurality of data compensating blocks, each of the data compensating blocks comprising:
   a memory cell configured to store an image signal;
   a one-time programmable (OTP) cell comprising a program transistor, the program transistor comprising a gate oxide and being configured to be irreversibly changed based on the image signal, the OTP cell being configured to output an output of the program transistor as an offset signal; and
   a calculator configured to output a compensation signal that is based on the offset signal output from the OTP cell and the image signal stored in the memory cell, and
   wherein a thickness of the gate oxide of the program transistor of the OTP cell in one of the data compensating blocks is different from a thickness of the gate oxide of the program transistor of the OTP cell in a different one of the data compensating blocks.

2. The data compensating device of claim 1, wherein the thickness of the gate oxide of the program transistor of the OTP cell corresponding to an upper bit of the image signal is greater than the thickness of the gate oxide of the program transistor of the OTP cell corresponding to a lower bit of the image signal.

3. The data compensating device of claim 1, wherein the thickness of the gate oxide of the program transistor of the OTP cell corresponding to an upper bit of the image signal is less than the thickness of the gate oxide of the program transistor of the OTP cell corresponding to a lower bit of the image signal.

4. The data compensating device of claim 1, wherein the OTP cell is broken down when a voltage greater than a break-down voltage is accumulated on a gate electrode of the program transistor.

5. The data compensating device of claim 4, wherein the break-down voltage increases as the thickness of the gate oxide of the program transistor increases.

6. The data compensating device of claim 4, wherein the break-down voltage decreases as the thickness of the gate oxide of the program transistor decreases.

7. The data compensating device of claim 1, wherein a conducting path is formed between a gate electrode and a channel region of the program transistor when a voltage greater than a threshold voltage is accumulated on the gate electrode of the program transistor.

8. The data compensating device of claim 1, wherein the program transistor acts as a capacitor when a voltage lower than a threshold voltage is accumulated on a gate electrode of the program transistor.

9. The data compensating device of claim 1, wherein the program transistor acts as a resistor when a voltage greater than a threshold voltage is accumulated on a gate electrode of the program transistor.

10. A display device comprising:
    a display panel comprising a plurality of pixels;
    a data compensator comprising a plurality of compensating blocks, the data compensator configured to output a compensation signal by compensating an image signal provided to the pixels in each of the compensating blocks;
    a scan driver configured to provide a scan signal to the plurality of pixels;
    a data driver configured to convert the compensation signal into a data signal and to provide the data signal to the plurality of pixels; and
    a timing controller configured to generate control signals that control the data compensator, the scan driver, and the data driver,
    wherein the data compensator comprises:
        a memory cell configured to store the image signal;
        a one-time programmable (OTP) cell comprising a program transistor, the program transistor comprising a gate oxide and configured to be irreversibly changed based on the image signal, the OTP cell being configured to output an output of the program transistor as an offset signal; and
        a calculator configured to output the compensation signal that is based on the offset signal output from the OTP cell and the image signal stored in the memory cell, and
    wherein a thickness of the gate oxide of the program transistor of the OTP cell in one of the compensating blocks is different from a thickness of the gate oxide of the program transistor of the OTP cell in a different one of the compensating blocks.

11. The display device of claim 10, wherein the thickness of the gate oxide of the program transistor of the OTP cell corresponding to an upper bit of the image signal is greater than the thickness of gate oxide of the program transistor of the OTP cell corresponding to a lower bit of the image signal.

12. The display device of claim 10, wherein the thickness of the gate oxide of the program transistor of the OTP cell corresponding to an upper bit of the image signal is less than the thickness of the gate oxide of the program transistor of the OTP cell corresponding to a lower bit of the image signal.

13. The display device of claim 10, wherein the OTP cell is broken down when a voltage greater than a break-down voltage is accumulated on a gate electrode of the program transistor.

14. The display device of claim 13, wherein the break-down voltage increases as the thickness of the gate oxide of the program transistor increases.

15. The display device of claim 13, wherein the break-down voltage decreases as the thickness of the gate oxide of the program transistor decreases.

16. The display device of claim 10, wherein a conducting path is formed between a gate electrode and a channel region of the program transistor when a voltage greater than a threshold voltage is accumulated on the gate electrode of the program transistor.

17. The display device of claim 10, wherein the program transistor acts as a capacitor when a voltage lower than a threshold voltage is accumulated on a gate electrode of the program transistor.

18. The display device of claim 10, wherein the program transistor acts as a resistor when a voltage greater than a threshold voltage is accumulated on a gate electrode of the program transistor.

19. The display device of claim 10, wherein the data compensator is coupled to the timing controller or is integral with the timing controller.

20. The display device of claim 10, wherein the data compensator is coupled to the data driver or is integral with the data driver.

* * * * *